(12) United States Patent
Qi et al.

(10) Patent No.: US 10,274,840 B2
(45) Date of Patent: Apr. 30, 2019

(54) ADAPTIVE GROOVE FOCUSING AND LEVELING DEVICE AND METHOD

(71) Applicant: SHANGHAI MICRO ELECTRONICS EQUIPMENT (GROUP) CO., LTD., Shanghai (CN)

(72) Inventors: Jingchao Qi, Shanghai (CN); Feibiao Chen, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 11 days.

(21) Appl. No.: 15/541,347

(22) PCT Filed: Dec. 27, 2015

(86) PCT No.: PCT/CN2015/099085
§ 371 (c)(1),
(2) Date: Jun. 30, 2017

(87) PCT Pub. No.: WO2016/107508
PCT Pub. Date: Jul. 7, 2016

(65) Prior Publication Data
US 2017/0351185 A1    Dec. 7, 2017

(30) Foreign Application Priority Data
Dec. 31, 2014   (CN) .......................... 2014 1 0851525

(51) Int. Cl.
*G03F 7/20*       (2006.01)
*G01B 11/06*    (2006.01)
(Continued)

(52) U.S. Cl.
CPC ...... *G03F 7/70641* (2013.01); *G01B 11/0608* (2013.01); *G01B 11/26* (2013.01); *G03F 9/7026* (2013.01); *G03F 9/7034* (2013.01)

(58) Field of Classification Search
CPC ... G03F 9/7026; G03F 9/7034; G03F 7/70641
(Continued)

(56) References Cited

U.S. PATENT DOCUMENTS 4,558,949 A   12/1985 Uehara et al.
5,191,200 A   3/1993 van der Werf et al.
(Continued)

FOREIGN PATENT DOCUMENTS

CN    101344727 A   1/2009
CN    102207694 A   10/2011

*Primary Examiner* — Thanh Luu
(74) *Attorney, Agent, or Firm* — Muncy, Geissler, Olds & Lowe, P.C.

(57) ABSTRACT

Disclosed is an adaptive groove focusing and leveling device for measuring the height and the inclination of the surface of a measured object (400). The measured object (400) is provided with cyclic grooves (401) in the surface and supported by a moving table; the focusing and leveling device sequentially comprises an illumination unit, a projection unit, a detection unit and a detector (212); the measured object (400) is positioned between the projection unit and the detection unit along the light path, the projection unit comprises a projection slit (203) and is used for forming a plurality of measuring points (501) on the measured object (400), and each measuring point (501) comprises at least three measuring child light spots (502), wherein the at least three measuring child light spots (502) are arranged at unequal intervals, so that when the plurality of measuring points (501) are projected to the surface of the measured object (400), at least two of the at least three measuring child light spots (502) of each measuring point (501) can be positioned outside the grooves (401), and then the height and the inclination of the surface of the measured object (400) are measured.

11 Claims, 7 Drawing Sheets

(51) Int. Cl.
*G01B 11/26* (2006.01)
*G03F 9/00* (2006.01)
(58) Field of Classification Search
USPC .......................................................... 250/548
See application file for complete search history.

(56) References Cited

U.S. PATENT DOCUMENTS

| | | |
|---|---|---|
| 5,955,739 A | 9/1999 | Kawashima |
| 2004/0135981 A1* | 7/2004 | Ina .................... G03F 9/7034 355/55 |
| 2009/0009739 A1 | 1/2009 | Kosugi |

* cited by examiner

ADAPTIVE GROOVE FOCUSING AND LEVELING DEVICE AND METHOD

TECHNICAL FIELD

The present invention relates to a projection lithography tool and, more particularly, to an focusing and leveling apparatus and method adaptable to trenches for use in a projection lithography tool.

BACKGROUND

Projection lithography tools are ones of those used as core processing equipment in the field of liquid crystal display (LCD). Through-silicon vias (TSVs) represent the latest technique for interconnection of chips by means of vertical conductive vias fabricated between the chips or wafers. TSVs offer the advantages of small package size, fast signal transmission, low power consumption and etc. Standard wafers subjected to a number of TSV processes often exhibit, at their edge portions, bonding inconsistencies, non-concentricities, wears, scribe lines, sputtered metals or insulating material on the surface or warps. Under such complex conditions, apparatuses for focusing and leveling are often incapable of measurement.

As shown in FIG. 1, a conventional detection device for focusing and leveling comprises a measuring optical path extending on both sides of an optical axis of a projection objective 20. In the measuring optical path, there are disposed an illumination unit, a projection unit, a detection unit and a relay unit in a sequence. Light emanated from a light source 21 of the illumination unit is converged at a light-source lens group 22 and then guided by an optical fiber to the projection unit, so as to provide lighting for the entire detection device. The projection unit is composed of a projection slit 23, a front projection lens group 24, a projection reflector group 25, a rear projection lens group 26 and the like. After propagating through the projection slit and the lens 24, being reflected by the reflector 25 and passing through the lens 26, the light forms a measuring light spot in the current exposure area on the surface of a glass substrate. The detection unit is made up of a front detection lens group 27, a detection reflector group 28, a rear detection lens group 29 and others. The relay unit is constituted of a relay reflector 30, a relay lens group 31, a detector 32, an arithmetic unit 33, a controller 34 and others. Light from the light spot travels through the relay unit and is received by the detector which thereby forms a light intensity signal carrying surface height information of the object under measurement (e.g., a glass substrate). This measurement approach requires the surface of the object under measurement to be flat, but the object under measurement 36, such as a wafer or a glass substrate, carried on the movable carrier stage 35 has trenches 41 (see FIG. 3) due to different processed layers.

As shown in FIGS. 2A and 2B, a solution has been proposed in order to address the issue of trenches 41, in which, an illumination numerical aperture A is designed to be greater than or equal to the product of a projection numerical aperture B multiplied by a detection numerical aperture M, which is, in turn, designed to be greater than or equal to the sum of the detection numerical aperture M and a tilt W of the object under measurement (i.e., A≥B*M≥M+W), in order to reduce shadows in images caused by the surface irregularities of the object under measurement which may lead to measurement errors. In many cases, interlaced patterns and wires are formed on a wafer surface. As a result, deviations in various directions are also generated from reflections. A projection aperture stop 50 may be shaped like a cross so that a distance d is created between the detection and projection light beams, ensuring easy reception of the detection light beam 51 with reduced measurement errors. Although this solution can mitigate the consequences of the object's surface irregularities to a certain extent, for a relative large trench 41 (as shown in FIG. 3), the measurement will be still impossible if the projection light beam is incident on the inner wall surface of the trench.

In the surface of an actual object 36 such as a wafer or the glass substrate, are often formed periodic trenches typically at a pitch on the order of millimeters, e.g., 5 mm, which are unfavorable to the measurement. Since the trenches themselves are sized on the order of hundreds of microns, e.g., 100 μm, it is likely for the measuring light spot to be formed partially or entirely within one of the trenches. This may introduce measurement errors or even make the measurement impossible. As shown in FIG. 3, when the measuring light spot is formed in part or as a whole within one of the trenches, the reflection in the optical path will occurs in an undesirable way in which the reflected light cannot be collected and the measurement of the object is thus affected adversely. When the reflected light is entirely reflected away by the trench, the measurement will be disabled.

SUMMARY OF THE INVENTION

It is an object of the present invention is to provide a focusing and leveling apparatus adaptable to trenches, for use in measuring a height and a tilt of an object under measurement.

In order to achieve this object, the present invention provides a focusing and leveling apparatus adaptable to trenches, used to measure a height and a tilt of a surface of an object under measurement. The trenches are formed in the surface of the object under measurement which is carried on a movable stage. The focusing and leveling apparatus comprises, disposed sequentially, an illumination unit, a projection unit, a detection unit and a detector. The object under measurement is disposed between the projection unit and the detection unit along an optical path. The projection unit comprises a projection slit configured to form a plurality of measuring points onto the object under measurement, each of the plurality of measuring points comprising at least three measuring light spots which are arranged in a non-equidistant manner such that upon projection of the plurality of measuring points on the surface of the object under measurement, at least two of the at least three measuring light spots of each of the plurality of measuring points are located outside the trenches, thereby allowing the measurement of the height and the tilt of the surface of the object under measurement.

Further, a size of each of the at least three measuring light spots may be greater than a width of each of the trenches.

Further, each of the plurality of measuring points may comprise three, four or five measuring light spots.

Further, a distance between a first and a last measuring light spots in each of the plurality of measuring points may be not equal to a multiple of a pitch of the trenches.

Further, s distance between any adjacent two of the at least three measuring light spots may be not equal to a multiple of the pitch of the trenches.

Further, a distance between any two of the at least three measuring light spots may be not equal to a multiple of a pitch of the trenches.

Further, the trenches have a pitch of 2 mm, wherein each of the plurality of measuring points comprises three measuring light spots and the distances between adjacent ones of the measuring light spots are 1.5 mm and 1 mm, respectively.

Further, upon projection of the plurality of measuring points onto the surface of the object under measurement, for each of the plurality of measuring points, at least two of the at least three measuring light spots that are located out of the trenches may be identified based on distance(s) between measuring light spots that are detected by the detector.

Further, the illumination unit may sequentially comprise a light source and a light-source lens group, wherein the projection unit comprises a projection slit, a front projection lens group, a projection reflector group and a rear projection lens group, disposed sequentially along the optical path, wherein the detection unit comprises a front detection lens group, a detection reflector group and a rear detection lens group, disposed sequentially along the optical path, and wherein the focusing and leveling apparatus further comprises a relay unit between the detection unit and the detector, the relay unit comprising a relay reflector and a relay lens group, disposed sequentially along the optical path.

In the focusing and leveling apparatus adaptable to trenches according to the present invention, as the illumination unit projects light onto the surface of the object under measurement via a projection slit in the projection unit which splits each measuring point into a number of non-equidistant sections, each measuring point projected on the surface of the object under measurement accordingly contains the same number of non-equidistant measuring light spots. Reflected light from the measuring light spots on the surface of the object under measurement is collected by the detection unit and is then input to the detector. In case of any of the measuring light spots located in one of the trenches, the detector identifies effective ones of the measuring light spots based on detected distance(s) between them, thereby enabling the height and tilt measurement of the object under measurement in which the trenches are formed, based on the effective measuring light spots. Herein, an effective measuring light spot refers to a measuring light spot located out of the trenches in the object under measurement, and an ineffective measuring light spot refers to a measuring light spot formed in one of the trenches in the object under measurement.

The present invention also provides a focusing and leveling method adaptable to trenches, used to measure a height and a tilt of the surface of an object under measurement. The trenches are formed periodically in the surface of the object under measurement which is carried on a movable stage. The method comprises the steps of: forming, by an focusing and leveling apparatus, a plurality of measuring points on the surface of the object under measurement, each of the plurality of measuring points comprising at least three measuring light spots arranged in a non-equidistant manner; moving the movable stage and hence the object under measurement carried thereon such that upon projection of the plurality of measuring points on the surface of the object under measurement, at least two of the at least three measuring light spots of each of the plurality of measuring points are located outside the trenches; and measuring the height and the tilt of the surface of the object under measurement by the focusing and leveling apparatus.

Further, the focusing and leveling method adaptable to trenches may further comprise: moving the movable stage to an initial position; detecting distances between the at least three measuring light spots by the focusing and leveling apparatus; and in the event of at least one of the at least three measuring light spots located in one of the trenches, relocating the at least three measuring light spots on the surface of the object under measurement by moving the object under measurement through the movable stage such that at least two of them are located outside the trenches.

Further, moving the object under measurement through the movable stage may comprise: moving the movable stage in a first horizontal direction by a distance that is equal to $1/10$ to $1/2$ of a pitch at which the trenches are distributed along the first horizontal direction; and moving the movable stage in a second horizontal direction by a distance that is equal to $1/10$ to $1/2$ of a pitch at which the trenches are distributed along the second horizontal direction.

Further, upon projection of the plurality of measuring points onto the surface of the object under measurement, for each of the plurality of measuring points, at least two of the at least three measuring light spots that are located out of the trenches may be identified based on distance(s) between them detected by the detector.

In the focusing and leveling method adaptable to trenches according to the present invention, the focusing and leveling apparatus as defined above is employed such that when any of the measuring light spot is located in one of the trenches, effective ones of the measuring light spots can be identified based on the distance(s) between measuring light spots that are detected by the focusing and leveling apparatus, thus enabling the height and tilt measurement of the object under measurement in which the trenches are formed.

In the figures depicting the prior art, 20 denotes a projection objective; 21, a light source; 22, a light-source lens group; 23, a projection slit; 24, a front projection lens group; 25, a projection reflector group; 26, a rear projection lens group; 27, a front detection lens group; 28, a detection reflector group; 29, a rear detection lens group; 30, a relay reflector; 31, a relay lens group; 32, a detector; 33, an arithmetic unit; 34, a controller; 35, a movable carrier stage; 36, an object under measurement; 41, a trench; 50, a projection aperture stop; and 51, a detection light beam.

In the figures depicting the present invention, 100 denotes a projection objective; 201, a light source; 202, a light-source lens group; 203, a projection slit; 204, a front projection lens group; 205, a projection reflector group; 206, a rear projection lens group; 207, a front detection lens group; 208, a detection reflector group; 209, a rear detection lens group; 210, a relay reflector; 211, a relay lens group; 212, a detector; 213, an arithmetic unit; 214, a controller; 300, a movable carrier stage; 400, an object under measurement; 401, a trench; 500, a light beam; 501, a measuring point; 502, a measuring light spot; P1, a first light spot; P2, a second light spot; P3, a third light spot; P4, a fourth light spot; and P5, a fifth light spot.

DETAILED DESCRIPTION

The present invention will be described below in detail with reference to the accompanying drawings.

Figure 4:
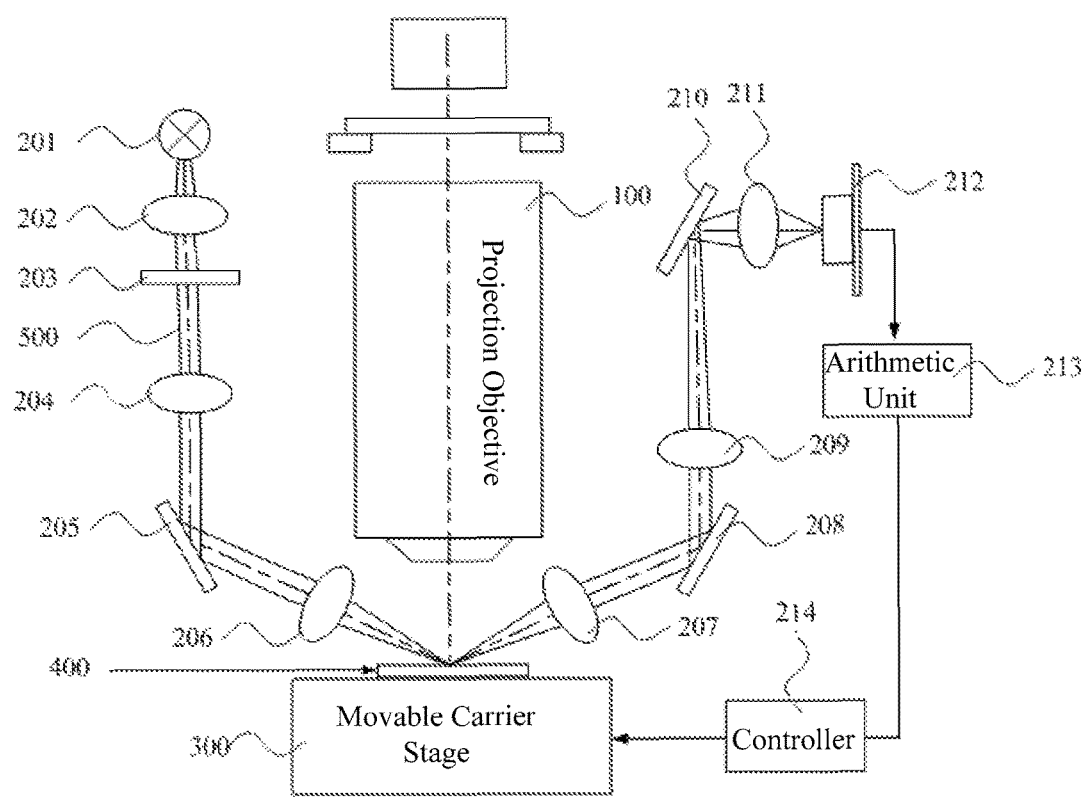
FIG. 4 is a structural schematic diagram of an apparatus for focusing and leveling according to the present invention.
Figure 5:
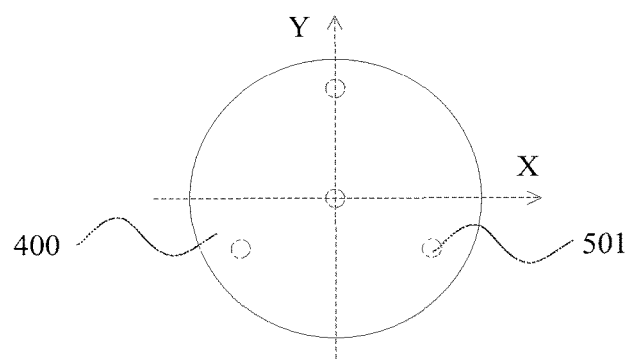
FIG. 5 schematically shows an arrangement of measuring points and measuring light spots according to the present invention.
Figure 6:
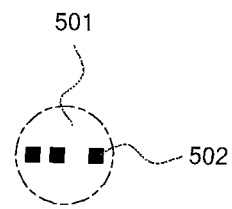
FIG. 6 is an enlarged view of one of the measuring light spots shown in FIG. 5.

Referring to FIGS. 4 to 6, the present invention provides a focusing and leveling apparatus adaptable to trenches, comprising a measuring optical path extending on both sides of an optical axis of a projection objective 100, along which there are disposed an illumination unit, a projection unit, a detection unit, a relay unit and a detector in a sequence.

With reference to FIG. 4, the illumination unit includes, sequentially disposed, a light source 201 and a light-source lens group 202. The light source 201 is a light source provided by the present invention. The light-source lens group 202 is adapted to transform a light beam from the light source 201 into a parallel light beam.

With reference to FIGS. 4, 5 and 6, the projection unit includes a projection slit 203, a front projection lens group 204, a projection reflector group 205 and a rear projection lens group 206, disposed sequentially in the optical path. By means of the projection slit 203, a number of measuring points 501 are formed on an object under measurement 400 (e.g., a wafer or a glass substrate). An exemplary distribution of the measuring points 501 is schematically illustrated in FIG. 5. Each of the measuring points 501 includes a number of measuring light spots 502 distributed in a non-equidistant manner, for example, as illustrated in FIG. 6. After propagating through the projection slit 203, the front projection lens group 204, the projection reflector group 205 and the rear projection lens group 206, the parallel light beam forms the measuring points 501 and hence the measuring light spots 502 in an exposure area on the surface of the object under measurement 400 such as a wafer.

With reference to FIG. 4, the detection unit includes a front detection lens group 207, a detection reflector group 208 and a rear detection lens group 209, disposed sequentially in the optical path. The front detection lens group 207 is configured to collect light from the measuring points 501 and hence from the measuring light spots 502 formed on the surface of the object under measurement 400. The direction of the optical path of the light collected from the measuring points 501 and hence from the measuring light spots 502 is deflected by the detection reflector group 208 and is then focused by the rear detection lens group 209 by passing therethrough.

With reference to FIG. 4, the relay unit includes a relay reflector 210 and a relay lens group 211, disposed sequentially along the optical path. The relay reflector 210 is adapted to bend the focused light such that it passes through the relay lens group 211 and is thereby further focused and is then incident on the detector 212. The detector 212 is adapted to identify effective one(s) in the measuring light spots 502 based on detected distance(s) therebetween so as to determine a height and a tilt of the object under measurement.

With reference to FIG. 4, the apparatus for focusing and leveling further includes an arithmetic unit 213 and a controller 214. The controller 214 contains a circuit that is connected to a movable carrier stage 300 on which the object under measurement 400 is carried. The arithmetic unit 213 is capable of converting an optical signal corresponding to the effective measuring light spots 502 detected by the detector 212 into an electrical signal. Based on a value of the electrical signal, the controller 214 determines whether to adjust the height and tilt of the object under measurement 400 through changing its six degree-of-freedom (DoF) directions. The six DoFs of the movable carrier stage 300 represent the freedom of translation on the three orthogonal coordinate axes X, Y and Z and rotation about these coordinate axes.

When no effective measuring light spot 502 is detected through the detector 212, it is known that the object under measurement 400 has excessive positional deviations and adjustments of its position are required to be made by the movable carrier stage 300 so as to relocate the measuring light spots 502 on the surface of the object under measurement 400. In this case, the positional adjustments of the object under measurement 400 may be accomplished by the arithmetic unit 213 and the controller 214 provided for the apparatus for focusing and leveling.

When only one effective measuring light spot 502 is detected by the detector 212, it will be unable to determine an identifier of the measuring light spot 502 based on its distance from another effective measuring light spot that is absent and hence which of the measuring light spots 502 corresponds to the effective one. In this case, in order to obtain more accurate measurement results, the position of the object under measurement 400 may be adjusted by the movable carrier stage 300 in order to relocate the measuring light spots 502 on the surface of the object under measurement 400 so that two or more effective measuring light spots 502 are detectable based on the distance between the effective light spots.

According to the present invention, each lens group may consist of one or more lenses, and each reflector group may consist of one or more reflectors.

Figure 8:
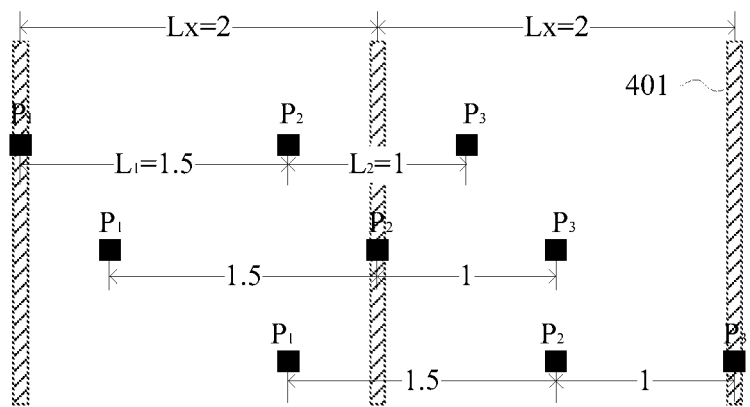
FIG. 8 schematically shows a positional relationship of three light spots and trenches spaced apart at a 2-mm pitch in accordance with the present invention.
Figure 9:
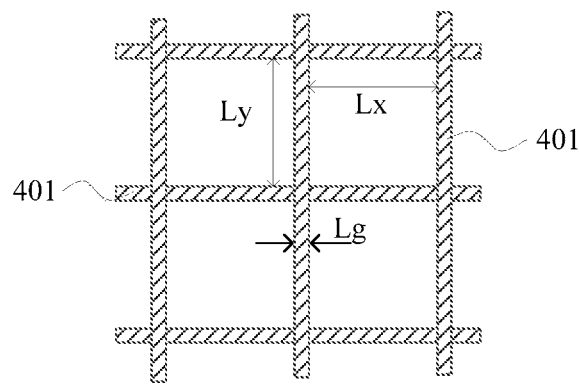
FIG. 9 schematically shows periodic trenches.

With reference to FIGS. 8 and 9, in the focusing and leveling apparatus adaptable to trenches, each measuring light spot 502 is sized larger than a width Lg of the trenches 401. For example, if the measuring light spots 502 are circular, their diameter may be larger than the width of the trenches 401, and if the measuring light spots 502 are square, their side length may be larger than the width of the trenches 401.

In a projection lithography tool, a detection device for focusing and leveling is often employed for height and tilt measurement of specific areas of the surface of a wafer. This detection device is usually required to provide a high accuracy while not causing damages on the wafer during its operations. Topographic irregularities (i.e., heights and tilts) of the wafer are measured in order to enable control of the wafer's gesture so as to ensure the wafer surface to be located within an effective focal depth range of the projection objective. The apparatus for focusing and leveling has at least three measuring points, four in this embodiment. A spatial plane defined by these measuring points is considered as representing the surface of the object under measurement, and the process of focusing and leveling is intended to bring this plane into an optimum focal plane of the projection objective. In accordance with the present invention, it is required that there are at least three measuring light spots in each measuring point and the light spots are spaced from one another non-equidistantly.

Figure 1:
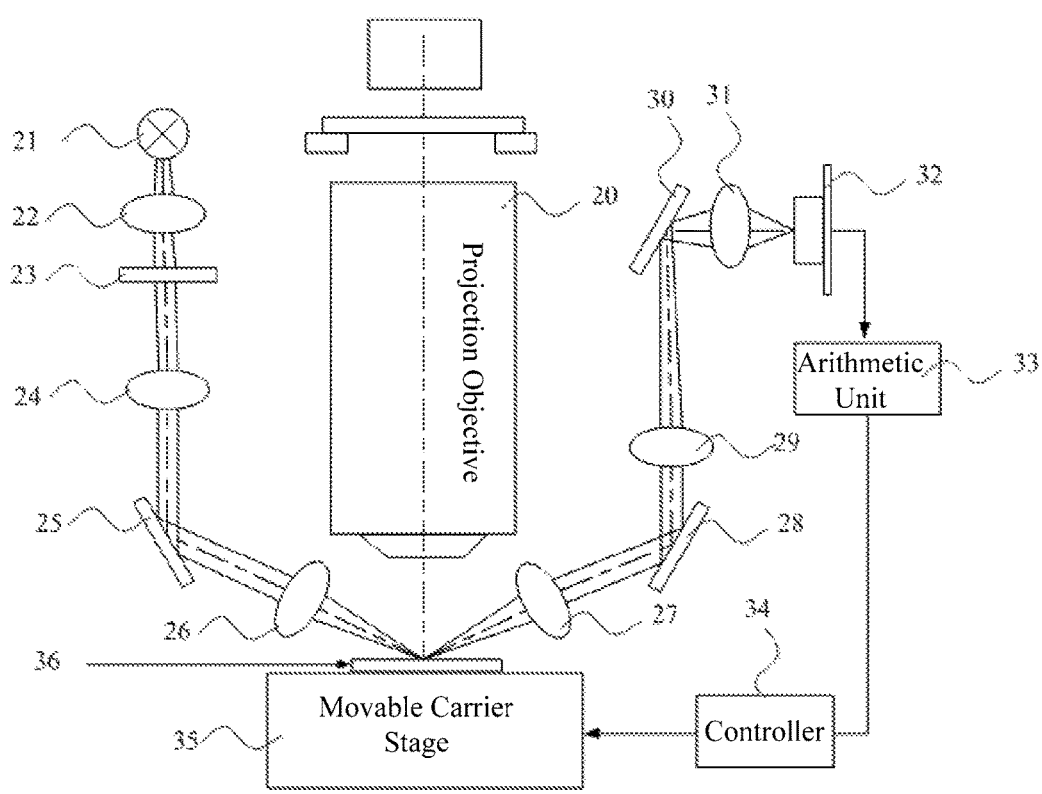
FIG. 1 is a structural schematic diagram of an apparatus for focusing and leveling according to the prior art.
Figure 2A:
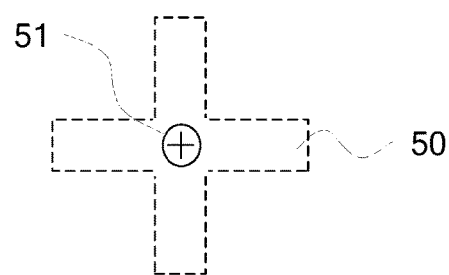
FIG. 2A is a diagram schematically showing a projected light spot according to the prior art.
Figure 2B:
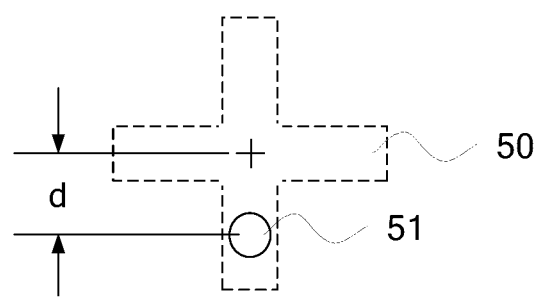
FIG. 2B is a diagram schematically showing a tolerance measurement on the projected light spot according to the prior art.
Figure 3:
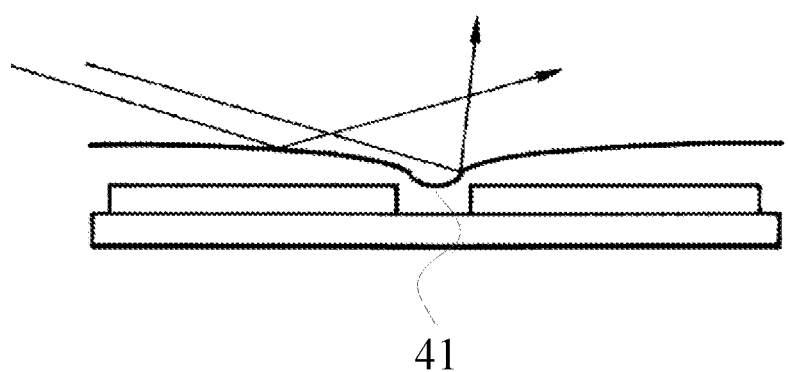
FIG. 3 schematically illustrates how a trench affects an optical path in accordance with the prior art.

FIG. 3 schematically shows how a trench affects the optical path. With reference to FIG. 3, when there is a trench in the surface of the object under measurement, it is likely for the reflected light to fail to pass through the detection unit and reach the detector. FIG. 9 schematically illustrates trenches formed in the surface of the object under measurement. With reference to FIG. 9, during exposure by the projection lithography tool, periodic trenches 401 are formed in the surface of the object under measurement due to various processes, and the direction of the trenches 401 typically parallel or perpendicular to a direction of the movable carrier stage. Generally, the trenches are spaced apart at a pitch on the order of millimeters, and their widths and depths are on the order of hundreds of microns. During measurement by the apparatus for focusing and leveling, if any measuring point is located in one of the trenches, the measurement may fail. In addition, the trench areas are usually not supposed to be measured by the apparatus for focusing and leveling, because they cannot reflect the topography of the whole exposure area on the surface of the object under measurement 400.

In this embodiment, principles in measurement are explained with each measuring point encompassing three equidistant measuring light spots, three non-equidistant measuring light spots, four non-equidistant measuring light spots, and five non-equidistant measuring light spots as examples.

With reference to FIGS. 7A, 7C, 7E and 7G measuring light spots 502 totally span a distance of 6 mm in each case. In order to discuss the consequences of location of measuring light spot(s) 502 in trench(es) 401, it is assumed that the pitch of the trenches 401 is 3 mm and that, in each case, the two outermost measuring light spots are located in respective trenches 401.

Figure 7A:
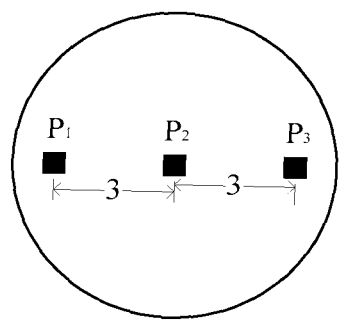
FIG. 7A schematically shows an arrangement of three equidistant light spots.
Figure 7B:
FIG. 7B is an image obtained when the three equidistant light spots shown in FIG. 7A are each located in a trench.

With reference to FIGS. 7A and 7B, three equidistant measuring light spots (hereinafter referred to as the "light spots") 502 are given the identifiers P1, P2, P3, where |P1−P2|=3 and |P2−P3|=3. In this case, each of the three light spots P1, P2, P3 is located in a respective trench 401. As a result, no light spot appears in an image obtained by the detector as shown in FIG. 7B.

Figure 7C:
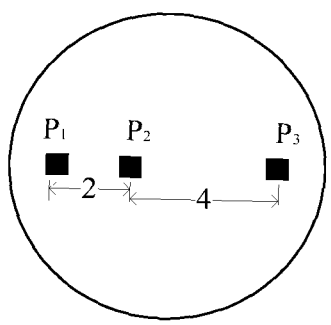
FIG. 7C schematically shows an arrangement of three non-equidistant light spots in accordance with one embodiment of the present invention.
Figure 7D:
FIG. 7D is an image obtained when part of the three non-equidistant light spots shown in FIG. 7C are each located in a trench.

With reference to FIGS. 7C and 7D, three light spot P1, P2, P3 are arranged non-equidistantly, where |P1−P2|=2 and |P2−P3|=4. In this case, each of the two outermost light spots P1, P3 is located in a respective trench 401. As a result, only one of the light spots is detected by the detector, i.e., being effective, as shown in FIG. 7D. However, as the identifier of the detected light spot remains unknown, the measurement is still impossible.

Figure 7E:
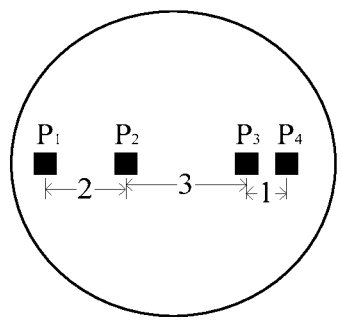
FIG. 7E schematically shows an arrangement of four non-equidistant light spots in accordance with one embodiment of the present invention.
Figure 7F:
FIG. 7F is an image obtained when part of the four non-equidistant light spots shown in FIG. 7E are each located in a trench.

With reference to FIGS. 7E and 7F, four non-equidistant light spots P1, P2, P3, P4 are arranged, where |P1−P2|=2, |P2−P3|=3 and |P3−P4|=1. In this case, each of the two outermost light spots P1, P4 is located in a trench 401, and an image obtained by the detector is shown in FIG. 7F. From the image, two of the light spots are identifiable. Based on the distance between these effective light spots, it can be known that their identifiers are P2 and P3. The measurement can be carried out based on positional information carried by these known effective light spots.

Figure 7G:
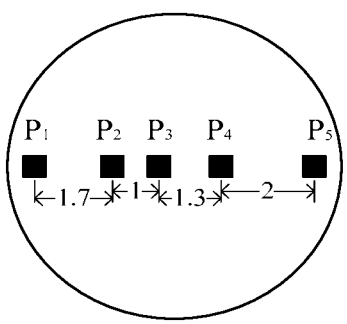
FIG. 7G schematically shows an arrangement of five non-equidistant light spots in accordance with one embodiment of the present invention.
Figure 7H:
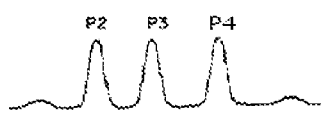
FIG. 7H is an image obtained when part of the non-equidistant light spots shown in FIG. 7G are each located in a trench.

With reference to FIGS. 7G and 7H, five non-equidistant light spots P1, P2, P3, P4, P5 are arranged, where |P1−P2|=1.7, |P2−P3|=1, |P3−P4|=1.3 and |P3−P4|=2. In this case, each of the two outermost light spots P1, P5 is located in a respective trench 401, and an image obtained by the detector is shown in FIG. 7H. Based on the distances between the effective light spots 502 identifiable from the image, it can be known that their identifiers are P2, P3 and P4. The measurement can be conducted based on positional information carried by these known effective light spots.

As apparent from the above-described arrangements of non-equidistant light spots and detection results, the present invention eliminates the impact of trenches on the results of height and tilt measurement on the object under measurement 400. In particular, better measurement results can be obtained from the arrangements with four or five non-equidistant light spots. With the number of effective light spots increasing, it will be easier to determine the identifiers of the light spots. In addition, more effective light spots result in higher credibility and accuracy of the results.

Analyzed above are several scenarios with trenches spaced at a certain pitch and with 3 to 5 or more non-equidistant light spots in which two or more are each located in one of the trenches. In cases where trenches are formed in the object under measurement at a pitch that is greater than 5 mm, if the apparatus for focusing and leveling is configured to form measuring light spots of which adjacent ones are spaced apart from each other by a distance of about 3 mm and the trenches 401 are formed with their widths smaller than the size of each single light spot, it will not happen that two or more of the light spots are simultaneously ineffective. As such, more accurate measurement results can be obtained by determining the identifiers of the effective ones of the light spots 502 based on the distance(s) between them.

In order to further describe the benefits of the present invention, an embodiment is set forth below in which under the conditions that trenches are formed at a pitch of 2 mm and each measuring points contains only three light spots, regardless of their locations, the light spots are always guaranteed to be as far from the trenches as possible while the identifiers of them are easily determinable based on the distance(s) between them. FIG. 8 schematically depicts three of the vertically-oriented periodic trenches. Wherein, among the three measuring light spots 502, those with the identifiers P1 and P2 are spaced apart by a distance of 1.5 mm, and those with the identifiers P2 and P3 are spaced apart by 1 mm. In case of the light spot P1 being located in a trench 401, i.e., being ineffective, P2 and P3 are effective, and the shortest one of the distances between the effective light spots and the trenches 401 is 0.5 mm. For example, P3 is 0.5 mm away from the second leftmost trench. In case of the light spot P2 being ineffective, i.e., being located in a trench 401, P1 and P3 are effective, and the shortest one of the distances between the effective light spots and the trenches 401 is 0.5 mm. For example, P1 is 0.5 mm away from the leftmost trench. In case of the light spot P3 being ineffective, i.e., being located in a trench 401, P1 and P2 are effective, and the shortest one of the distances between the effective light spots and the trenches 401 is 0.5 mm. For example, P1 is 0.5 mm away from the second leftmost trench. In summary, even when a certain one of the light spots is ineffective, it is always guaranteed that one of the effective light spots is always 0.5 mm away from the nearest trench. In addition, the difference between the distances between the light spots is also 0.5 mm. This ensures no impact on the measurement signal as well as easy determination of the light spots' identifiers, enabling the height and tilt measurement on the object under measurement 400.

In the focusing and leveling apparatus adaptable to trenches according to the present invention, as each measuring point 501 is split by the projection slit 203 into a number of non-equidistant measuring light spots 502, each measuring point projected on the surface of the object under measurement 400 also contains the same number of non-equidistant measuring light spots. In case of any of the measuring light spots 502 located in one of the trenches 401, identifiers of effective ones of the measuring light spots 502 that are formed out of the trenches can be determined based on detected distance(s) between them, and the height and tilt of the object under measurement can be determined based on positional information carried by these effective measuring light spots 502.

In accordance with the present invention, as the measuring light spots are non-equidistantly arranged, it is easy to determine the identifiers of detected measuring light spots and hence obtain the height and tilt of the object under measurement at the locations corresponding to them. In addition, their non-equidistant arrangements preclude the possibility of simultaneous location of two or more of them in trenches, achieving adaptation of the height and tilt measurement on the object under measurement to the trenches.

According to the present invention, the number of the non-equidistant measuring light spots 502 is at least three. This avoids incapability of adaptation of the height and tilt measurement on the object under measurement to the impact of the trenches due to employment of one measuring point or location of all equidistant light spots in trenches 401.

In a preferred embodiment, in the focusing and leveling apparatus adaptable to trenches according to the present invention, the distance between the first and last measuring light spots 502 in each measuring point 501 is not equal to a multiple of a pitch of the trenches 401. As such, it is prevented that either the first or last measuring light spot 502 is located in one of the trenches 401.

In a preferred embodiment, in the focusing and leveling apparatus adaptable to trenches according to the present invention, the distance between any adjacent two of the measuring light spots 502 is not equal to a multiple of the pitch of the trenches 401. As such, it is prevented that any adjacent two of the measuring light spots 502 are both located in respective ones of the trenches 401.

In a preferred embodiment, in the focusing and leveling apparatus adaptable to trenches according to the present invention, the distance between any two of the measuring light spots 502 is not equal to a multiple of the pitch of the trenches 401. As such, it is prevented that any two of the measuring light spots 502 are both located in respective ones of the trenches 401.

As can be perceived from the above three relationships of measuring light spots 502 and multiples of the trench pitch, the non-equidistant arrangements of the measuring light spots 502 according to the present invention are intended to stagger the measuring light spots 502 from the periodic trenches 401 in order to increase the number of effective measuring light spots 502 so that more effective measuring light spots can serve as the basis for the height and tilt measurement of the object under measurement.

Figure 10:
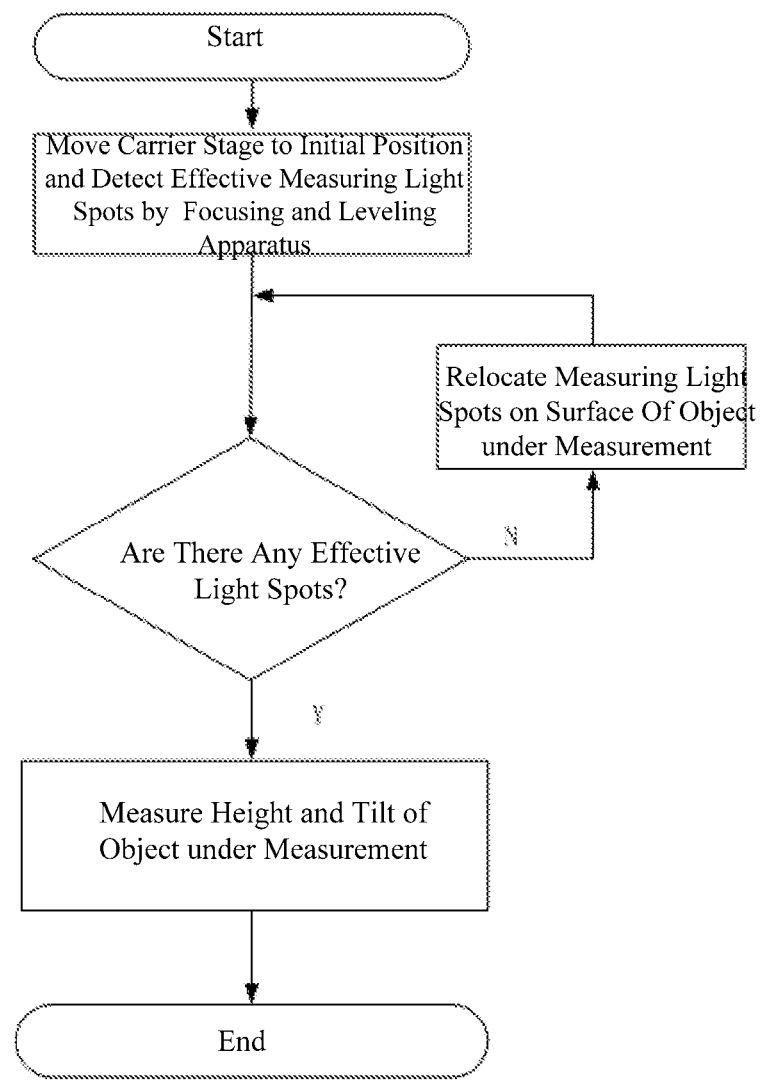
FIG. 10 is a flowchart graphically illustrating a method for focusing and leveling in accordance with one embodiment of the present invention.

With reference to FIG. 10, the present invention also provides a method for focusing and leveling adaptable to trenches, using the focusing and leveling apparatus adaptable to trenches as described above. It is based on the concept that the apparatus for focusing and leveling forms a plurality of measuring points 501 on the surface of an object under measurement 400, each comprising a number of measuring light spots 502 arranged in a non-equidistant manner, following by moving the movable carrier stage 300 to an initial position, detecting the measuring light spots 502 with the detector 212 of the apparatus for focusing and leveling, in case of any of the measuring light spots 502 located in one of the trenches 401, identifying effective ones of the measuring light spots 502 based on the distance(s) between them detected by the apparatus for focusing and leveling, and measuring the height and tilt of the object under measurement.

In case of two or more measuring light spot 502 located outside the trenches 401 in the object under measurement 400, i.e., two or more effective measuring light spots, the height and tilt of the object under measurement 400 are measured based on these effective measuring light spots 502. Otherwise, the measuring light spots 502 formed on the surface of the object under measurement 400 are relocated away from the trenches 401. In accordance with the present invention, the six DoF directions of the movable carrier stage are adjusted based on the height and tilt of the object under measurement 400 so as to accomplish adjusting the object under measurement 400. Herein, an effective measuring light spot refers to a measuring light spot located out of the trenches in the object under measurement, whilst an ineffective measuring light spot refers to a measuring light spot that is situated, in part or as a whole, in one of the trenches in the object under measurement, and is thus deformed and undetectable.

In a preferred embodiment, in the proposed method for focusing and leveling adaptable to trenches, in the event of any of the measuring light spots 502 located in one of the trenches 410, the measuring light spots 502 projected on the surface of the object under measurement 400 are relocated from the trench 401 by adjusting the movable carrier stage 300 that carries the object under measurement 400. The relocation of the light spots 502 on the object under measurement 400 is accomplished by changing the horizontal and vertical DoF directions of the movable carrier stage 300 that carries the object under measurement 400. Relocation of the light spots 502 on the object under measurement 400 is eventually relocation of the measuring points.

In this embodiment, adjusting the movable carrier stage 300 may be specifically accomplished by horizontally moving the movable carrier stage 300 a distance that is equal to ½ of a pitch Lx at which the trenches 401 are distributed along the horizontal direction and vertically moving the movable carrier stage 300 a distance that is equal to ½ of a pitch Ly at which the trenches 401 are distributed along the vertical direction. In FIG. 9, Lg represents a width of the trenches 401. That is, the positional adjustments of the movable carrier stage 300 in the horizontal and vertical DoF directions are related to the horizontal and vertical pitches of the trenches 401 distributed on the object under measurement 400. During the horizontal or vertical positional adjustment, the distance moved is not limited to ½ of the trench pitch, as it may also be ⅓, ¼, ⅕, ⅙, ⅐, ⅛, ⅑, ⅒ or the like thereof. Additionally, the distance actually moved may be adjusted according to the pitches of the trenches.

In the method for focusing and leveling adaptable to trenches according to the present invention, the apparatus for focusing and leveling as defined above is employed so that when any of the measuring light spot is formed in one of the trenches, effective ones of the measuring light spots can be identified based on the distance(s) between them detected by the apparatus for focusing and leveling, thus enabling the height and tilt measurement of the object under measurement in which the trenches are formed.

What is claimed is:

1. A focusing and leveling apparatus adaptable to trenches, used to measure a height and a tilt of a surface of an object under measurement, the object under measurement having trenches formed in the surface thereof and the object under measurement being carried on a movable stage, wherein the focusing and leveling apparatus comprises, disposed sequentially, an illumination unit, a projection unit, a detection unit and a detector, the object under measurement disposed between the projection unit and the detection unit along an optical path, the projection unit comprising a projection slit configured to form a plurality of measuring points onto the object under measurement, each of the plurality of measuring points comprising at least three measuring light spots which are arranged in a non-equidistant manner such that upon projection of the plurality of measuring points on the surface of the object under measurement, at least two of the at least three measuring light spots of each of the plurality of measuring points are located outside the trenches, thereby allowing the measurement of the height and the tilt of the surface of the object under measurement, and wherein a distance between any two of the at least three measuring light spots is not equal to a multiple of a pitch of the trenches.

2. The focusing and leveling apparatus adaptable to trenches according to claim 1, wherein a size of each of the at least three measuring light spots is greater than a width of each of the trenches.

3. The focusing and leveling apparatus adaptable to trenches according to claim 1, wherein each of the plurality of measuring points comprises three, four or five measuring light spots.

4. The focusing and leveling apparatus adaptable to trenches according to claim 1, wherein a distance between a first and a last measuring light spots in each of the plurality of measuring points is not equal to a multiple of a pitch of the trenches.

5. The focusing and leveling apparatus adaptable to trenches according to claim 4, wherein a distance between any adjacent two of the at least three measuring light spots is not equal to a multiple of the pitch of the trenches.

6. The focusing and leveling apparatus adaptable to trenches according to claim 1, wherein the trenches have a pitch of 2 mm, wherein each of the plurality of measuring points comprises three measuring light spots, and wherein distances between adjacent ones of the measuring light spots are 1.5 mm and 1 mm, respectively.

7. The focusing and leveling apparatus adaptable to trenches according to claim 1, wherein upon projection of the plurality of measuring points onto the surface of the object under measurement, for each of the plurality of measuring points, at least two of the at least three measuring light spots that are located outside of the trenches are identified based on distance(s) between measuring light spots that are detected by the detector.

8. The focusing and leveling apparatus adaptable to trenches according to claim 1, wherein the illumination unit sequentially comprises a light source and a light-source lens group, wherein the projection unit comprises a projection slit, a front projection lens group, a projection reflector group and a rear projection lens group, disposed sequentially along the optical path, and wherein the detection unit comprises a front detection lens group, a detection reflector group and a rear detection lens group, disposed sequentially along the optical path, and wherein a relay unit is provided between the detection unit and the detector, the relay unit comprising a relay reflector and a relay lens group, disposed sequentially along the optical path.

9. A focusing and leveling method adaptable to trenches, used to measure a height and a tilt of a surface of an object under measurement, the object under measurement having trenches periodically formed in the surface thereof and the object under measurement being carried on a movable stage, wherein the method comprises the steps of: forming, by a focusing and leveling apparatus, a plurality of measuring points on the surface of the object under measurement, each of the plurality of measuring points comprising at least three measuring light spots arranged in a non-equidistant manner; moving the movable stage and hence the object under measurement carried thereon such that upon projection of the plurality of measuring points on the surface of the object under measurement, at least two of the at least three measuring light spots of each of the plurality of measuring points are located outside the trenches; and measuring the height and the tilt of the surface of the object under measurement by the focusing and leveling apparatus; and wherein the method further comprises: moving the movable stage to an initial position; detecting distances between the at least three measuring light spots by the focusing and leveling apparatus; and if at least one of the at least three measuring light spots is located in one of the trenches, relocating the at least three measuring light spots on the surface of the object under measurement by moving the object under measurement through the movable stage such that at least two of the at least three measuring light spots are located outside the trenches.

10. The focusing and leveling method adaptable to trenches according to claim 9, wherein moving the object under measurement through the movable stage comprises: moving the movable stage in a first horizontal direction by a distance that is equal to ⅒ to ½ of a pitch at which the trenches are distributed along the first horizontal direction; and moving the movable stage in a second horizontal direction by a distance that is equal to ⅒ to ½ of a pitch at which the trenches are distributed along the second horizontal direction.

11. The focusing and leveling method adaptable to trenches according to claim 9, wherein upon projection of the plurality of measuring points onto the surface of the object under measurement, for each of the plurality of measuring points, at least two of the at least three measuring light spots that are located outside of the trenches are identified based on distance(s) between measuring light spots that are detected by a detector.

\* \* \* \* \*